(12) United States Patent
Long et al.

(10) Patent No.: US 9,971,187 B2
(45) Date of Patent: May 15, 2018

(54) METHOD FOR FABRICATING PHOTORESIST PATTERN, COLOR FILTER AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Qingde Long, Beijing (CN); Yulong Kang, Beijing (CN); Yuan Liang, Beijing (CN); Zhiyong Zhang, Beijing (CN); Liwei Fan, Beijing (CN)

(73) Assignees: BOE TECHNOLOGY GROUP CO., LTD., Beijing (CN); CHENGDU BOE OPTOELECTRONICS TECHNOLGY CO., LTD., Chengdu (CN)

( * ) Notice: Subject to any disclaimer, the term of this patent is extended or adjusted under 35 U.S.C. 154(b) by 68 days.

(21) Appl. No.: 15/307,295

(22) PCT Filed: Mar. 2, 2016

(86) PCT No.: PCT/CN2016/075361
§ 371 (c)(1),
(2) Date: Oct. 27, 2016

(87) PCT Pub. No.: WO2017/049878
PCT Pub. Date: Mar. 30, 2017

(65) Prior Publication Data
US 2017/0269424 A1    Sep. 21, 2017

(30) Foreign Application Priority Data

Sep. 24, 2015    (CN) .......................... 2015 1 0617500

(51) Int. Cl.
*G03F 7/20* (2006.01)
*G02F 1/1335* (2006.01)
(Continued)

(52) U.S. Cl.
CPC ....... *G02F 1/133512* (2013.01); *G02B 5/201* (2013.01); *G02F 1/133516* (2013.01);
(Continued)

(58) Field of Classification Search
CPC ...... G03F 7/095; G03F 7/0955; G03F 7/0007; G03F 7/2024; G03F 7/2032; G02B 5/201;
(Continued)

(56) References Cited

U.S. PATENT DOCUMENTS

| 4,533,624 A | 8/1985 | Sheppard |
| 2004/0100596 A1* | 5/2004 | Lan ..................... G02F 1/13394 349/110 |

(Continued)

FOREIGN PATENT DOCUMENTS

| CN | 105116685 | 12/2015 |
| EP | 0098922 | 1/1984 |
| JP | 2000194141 | 7/2000 |

OTHER PUBLICATIONS

Written Opinion of the International Searching Authority from corresponding PCT Application No. PCT/CN2016/075361, dated Jul. 4, 2016 (5 pages).

*Primary Examiner* — John A McPherson
(74) *Attorney, Agent, or Firm* — Harness, Dickey & Pierce, P.L.C.

(57) ABSTRACT

The disclosure provides in some embodiments a method for fabricating a photoresist pattern, a color filter and a method for fabricating the same, and a display device. The method for fabricating a photoresist pattern includes coating negative photoresist on a base substrate to form a first photoresist
(Continued)

layer, coating positive photoresist on the first photoresist layer to form a second photoresist layer, conducting a first exposure process on first regions of the second photoresist layer, conducting a first developing process to remove the positive photoresist within the first regions of the second photoresist layer and the negative photoresist within second regions of the first photoresist layer, so as to obtain a first photoresist pattern and a second photoresist pattern, conducting a second exposure process on the first photoresist pattern and the second photoresist pattern, and conducting a second developing process to remove the first photoresist pattern.

20 Claims, 4 Drawing Sheets

(51) Int. Cl.
 G02B 5/20 (2006.01)
 G03F 7/00 (2006.01)
 G03F 7/095 (2006.01)

(52) U.S. Cl.
 CPC ............ *G03F 7/0007* (2013.01); *G03F 7/095* (2013.01); *G03F 7/0955* (2013.01); *G03F 7/2024* (2013.01); *G03F 7/2032* (2013.01); *G02F 2001/133519* (2013.01)

(58) Field of Classification Search
 CPC ............... G02B 5/223; G02F 1/133412; G02F 1/122514; G02F 1/133516
 USPC ..................................... 430/7, 394
 See application file for complete search history.

(56) References Cited

U.S. PATENT DOCUMENTS

| | | | |
|---|---|---|---|
| 2007/0172774 A1* | 7/2007 | Limb | G03F 7/0007 430/322 |
| 2009/0130599 A1* | 5/2009 | Daubenspeck | G03F 7/095 430/312 |
| 2013/0234302 A1* | 9/2013 | Hu | G03F 7/0041 257/635 |
| 2015/0205019 A1* | 7/2015 | Kawanishi | G02F 1/133516 359/885 |

* cited by examiner

METHOD FOR FABRICATING PHOTORESIST PATTERN, COLOR FILTER AND DISPLAY DEVICE

CROSS-REFERENCE TO RELATED APPLICATION

This application claims priority of Chinese Patent Application No. 201510617500.4, which was filed on Sep. 24, 2015, the disclosures of which are incorporated herein by reference in their entirety.

FIELD

This disclosure relates to the field of displaying technology, in particular to a method for fabricating a photoresist pattern, a color filter, and a display device.

BACKGROUND

A color filter is one of key elements for colorization of a Liquid Crystal Display (LCD). Specifically, through the color filter, strong light rays emitted by a backlight module of the LCD can be converted into a colorful picture. With respect to fabricating a color filter, a black matrix is to be disposed on a glass substrate in form of grids, and then color blocking elements for three primary colors, i.e., Red (R), Green (G), and Blue (B), are arranged on respective pixel units defined by the black matrix in turn.

As shown in FIG. 1, when fabricating a black matrix, it is usually to coat black photoresist on a glass substrate 01 to form a photoresist layer 02. And then, as shown in FIG. 2, exposure and developing processes are performed on the photoresist layer 02 using a mask 03. Finally, as shown in FIG. 3, a black matrix 04 is obtained and retained on the glass substrate 01.

Insofar as a black matrix having a line width of around 5 μm can be achieved, when the line width thereof is reduced further, many deforms or malfunctions may occur, including a reaction happened due to a large-area contact between black matrix photoresist and developer, a film/layer peel-off occurrence, uneven edges, and so on. Nevertheless, as products having high Pixels Per Inch (PPI) are prevailing in the market, a black matrix having a line width of around 5 μm can hardly meet the requirements for LCD products in terms of transmittance ratio and aperture ratio. Therefore, it is a highly demanding job to come up with a solution about how to fabricate a black matrix pattern having a narrow line width.

BRIEF DESCRIPTION

The present disclosure provides in some embodiments a method for fabricating a photoresist pattern, a color filter and a method for fabricating the same, and a display device, which can achieve a black matrix having a narrow line width and improve its transmittance ratio and aperture ratio of the display device.

In a first aspect, embodiments of the present disclosure adopts the following technical solution: embodiments of the present disclosure provide a method for fabricating a photoresist pattern, which includes coating negative photoresist on a base substrate to form a first photoresist layer, coating positive photoresist on the first photoresist layer to form a second photoresist layer, conducting a first exposure process on first regions of the second photoresist layer, conducting a first developing process to remove the positive photoresist within the first regions of the second photoresist layer and form a first photoresist pattern of the second photoresist layer, while to remove the negative photoresist within second regions of the first photoresist layer and form a second photoresist pattern of the first photoresist layer, conducting a second exposure process on the first photoresist pattern and the second photoresist pattern, and conducting a second developing process to remove the first photoresist pattern but to retain the second photoresist pattern. Herein, a line width of the first photoresist pattern is larger than that of the second photoresist pattern, and a projection of each of the first regions on the base substrate is located within that of a corresponding one of the second regions on the base substrate.

In one possible embodiment, the negative photoresist and positive photoresist are coated on the base substrate in turn, so as to form the first photoresist layer and the second photoresist layer thereon.

In one possible embodiment, the first exposure process is conducted on the second photoresist layer using a mask that is provided with light transmitting regions and light shielding regions, the light transmitting regions corresponding to the first regions of the second photoresist layer.

In one possible embodiment, the first developing process is conducted using developer to remove the positive photoresist within the first regions of the second photoresist layer as well as the negative photoresist beneath the positive photoresist to be removed and at its perimeter, so as to obtain the first photoresist pattern and the second photoresist pattern.

In one possible embodiment, the mask is provided with a predetermined line width of 8 μm, while a line width of the second photoresist pattern is 4 μm.

In one possible embodiment, conducting the first developing process on the first regions of the second photoresist layer includes conducting the first developing process on the first regions of the second photoresist layer in accordance with a predetermined developing time period.

In one possible embodiment, conducting the first developing process using the developer includes conducting the first developing process in accordance with a predetermined temperature or concentration of the developer.

In one possible embodiment, the negative photoresist is black negative photoresist, and a photo-sensitivity range of the negative photoresist and that of the positive photoresist partially overlap or do not overlap.

In one possible embodiment, the method further includes conducting a vacuum dry process and a soft bake process on the base substrate provided with the first photoresist layer, subsequent to the forming of the first photoresist layer, and conducting another vacuum dry process and another soft bake process on the base substrate provided with the first photoresist layer and the second photoresist layer, subsequent to the forming of the second photoresist layer.

In one possible embodiment, conducting the second exposure process includes conducting the second exposure process both on the first photoresist pattern from the upper side of the base substrate and on the second photoresist pattern from the lower side of the base substrate.

In one possible embodiment, conducting the second developing process includes conducting the second developing process using developer to remove the first photoresist pattern but to retain the second photoresist pattern.

In one possible embodiment, the method further includes curing the base substrate provided with the black matrix.

In one possible embodiment, the curing process is conducted in a situation where temperature is within a range of 160°~230°.

In one possible embodiment, the developer includes at least one of low-concentration inorganic alkaline and low-concentration organic alkaline.

In one possible embodiment, the inorganic alkaline includes at least one of sodium hydroxide, potassium hydroxide, sodium bicarbonate, and potassium bicarbonate. In one possible embodiment, the organic alkaline includes at least one of amine compounds, alkali metal salts, and alkyl lithium compounds. And the amine compounds is chosen from a group of tetramethylammonium hydroxide (TMAOH), sodium methoxide, and potassium ethoxide.

In a second aspect, embodiments of the present disclosure provide a method for fabricating a color filter, which includes the above method for fabricating the photoresist pattern.

In a third aspect, embodiments of the present disclosure provide a color filter, which includes the photoresist pattern formed by using any one of the above methods.

In a fourth aspect, embodiments of the present disclosure provide a display device, which includes the above color filter.

According to the method for fabricating the photoresist pattern, the color filter and the method for fabricating the same, and the display device provided by embodiments of the present disclosure, negative photoresist and positive photoresist are coated on a base substrate to form a first photoresist layer and a second photoresist layer at first. Further, a first exposure process and a first developing process are conducted on first regions of the second photoresist layer, so as to remove the positive photoresist within the first regions of the second photoresist layer and the negative photoresist within second regions of the first photoresist layer, and to obtain a first photoresist pattern retained within the second photoresist layer and a second photoresist pattern retained within the first photoresist layer, wherein a line width of the first photoresist pattern is larger than that of the second photoresist pattern, and a projection of each of the first regions on the base substrate is located within that of a corresponding one of the second regions on the base substrate. Finally, a second exposure process is conducted on the first photoresist pattern and the second photoresist pattern, and a second developing process is conducted to remove the first photoresist pattern but to retain the second photoresist pattern that serves as the black matrix. As seen from the above, as for the first developing process, the first regions of the second photoresist layer exposed react with the developer and dissolve. After the dissolve process completes, the negative photoresist within the first photoresist layer that has not yet been exposed and is beneath the first regions happens to dissolve in turn. Further, the negative photoresist that is covered by the unexposed second photoresist layer happens to dissolve alike, due to its contact with the developer in a lateral direction, which results in that peripheral parts of the negative photoresist that is covered by the unexposed second photoresist layer dissolves. As a result, by taking advantage of the positive photoresist within the second photoresist layer as a surface cover, the negative photoresist within the first photoresist layer is prevented from getting a direct and large-area contact with developer for reaction. As such, when the negative photoresist is adopted as the black negative photoresist used for fabricating the black matrix, a film/layer peel-off occurrence due to a direct contact between black matrix photoresist and developer for fabricating the black matrix having a narrow line width can be prevented, the black matrix having a narrow line width can be achieved accordingly, and its transmittance ratio and aperture ratio of the display device can be improved.

BRIEF DESCRIPTION OF THE DRAWINGS

In order to illustrate the technical solutions of the present disclosure or the related art in a more apparent manner, the drawings desired for the embodiments of the present disclosure will be described briefly hereinafter. Obviously, the following drawings merely relate to some embodiments of the present disclosure, and based on these drawings, a person skilled in the art may obtain the other drawings without any creative effort.

DETAILED DESCRIPTION

With respect to the following description, not for the purpose of limitation but for the purpose of description, detailed description about particular system structures, interfaces, and techniques has been given for better appreciation of the present disclosure. However, a skilled person can understand that the present disclosure can also be achieved without certain detailed description in some embodiments. In other cases, detailed description on well-known devices, circuits, and methods has been omitted, so as not to obscure the essence of the present disclosure unnecessarily.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Unless otherwise indicated, "a plurality of" refers to two or more than two.

When introducing elements of the present disclosure or the embodiments thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

Figure 1:
FIG. 1 is a first diagram illustrating a method for fabricating a black matrix according to the related arts.
Figure 2:
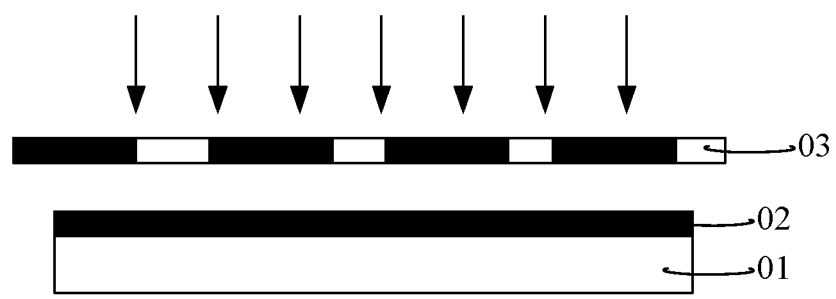
FIG. 2 is a second diagram illustrating the method for fabricating the black matrix according to the related arts.
Figure 3:
FIG. 3 is a third diagram illustrating the method for fabricating the black matrix according to the related arts.
Figure 4:
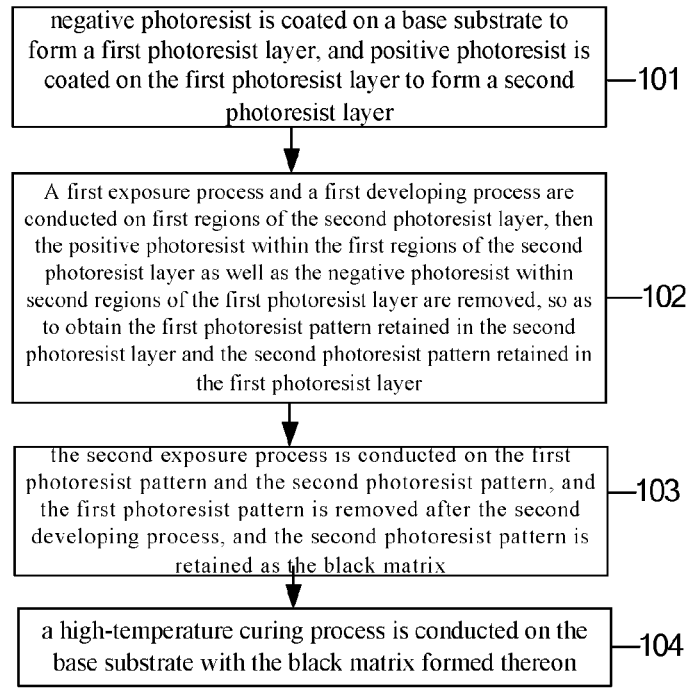
FIG. 4 is a first flow chart illustrating a method for fabricating a photoresist pattern according to an embodiment of the present disclosure.

As shown in FIG. 4, an embodiment of the present disclosure provides a method for fabricating a photoresist pattern, which includes, for example, steps 101~104 as below.

In step 101, negative photoresist is coated on a base substrate to form a first photoresist layer, and positive photoresist is coated on the first photoresist layer to form a second photoresist layer.

Figure 5:
FIG. 5 is a first diagram illustrating a structure of the black matrix according to an embodiment of the present disclosure.

Specifically, as shown in FIG. 5, negative photoresist and positive photoresist are coated on the base substrate 11 in turn, such that the negative photoresist forms the first photoresist layer 12, and the positive photoresist forms the second photoresist layer 13 arranged on or above the first photoresist layer 12.

Herein, the negative photoresist may specifically refer to black negative photoresist used for fabricating a black matrix, which will be used only as an example to elaborate subsequent embodiments of the present disclosure.

Generally, the photoresist can be classified into positive photoresist and negative photoresist. A part within the positive photoresist that is irradiated by light rays is inclined to dissolve into photoresist developer, while other parts within the positive photoresist that is absent from irradiation by light rays will not dissolve into photoresist developer or dissolve extremely slowly. As opposed to it, a part within the negative photoresist that is irradiated by light rays is not inclined to dissolve into photoresist developer or dissolve extremely slowly, while other parts within the negative photoresist that is absent from irradiation by light rays is inclined to dissolve into photoresist developer.

In addition, a vacuum dry process and a soft bake process may be conducted on the first photoresist layer 12, after the base substrate 11 is coated with the black negative photoresist to form the first photoresist layer 12. Namely, the base substrate 11 provided with the first photoresist layer 12 is subject to a vacuum dry process having a reduced pressure and a pre-bake process, so as to form a solid-state film layer, which results in removing solvent in the first photoresist layer 12 by an evaporation process. Further, the first photoresist layer 12 is coated with the positive photoresist to form the second photoresist layer 13, such that an adhesion between the first photoresist layer 12 and the second photoresist layer 13 can be enhanced.

Similarly, the second photoresist layer 13 may well be subject to a vacuum dry process and a soft bake process, after its formation.

Specifically, a thickness of either the first photoresist layer 12 or the second photoresist layer 13 may be chosen from a range of 0.9 μm~2.5 μm.

In addition, the base substrate 11 may be a glass substrate, alternatively be a flexible transparent substrate adhered to the glass substrate, which is not limited in the present disclosure.

In step 102, a first exposure process and a first developing process are conducted on first regions of the second photoresist layer. Thereafter, the positive photoresist within the first regions of the second photoresist layer as well as the negative photoresist within second regions of the first photoresist layer are removed, so as to obtain the first photoresist pattern retained in the second photoresist layer and the second photoresist pattern retained in the first photoresist layer.

Figure 6:
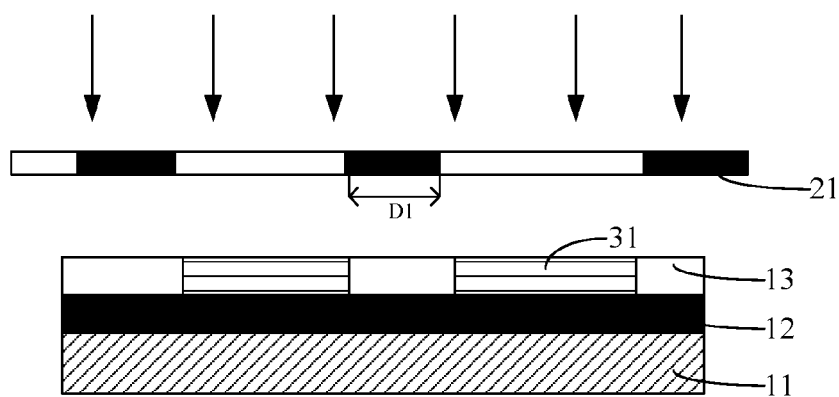
FIG. 6 is a second diagram illustrating another structure of the black matrix according to an embodiment of the present disclosure.
Figure 8:
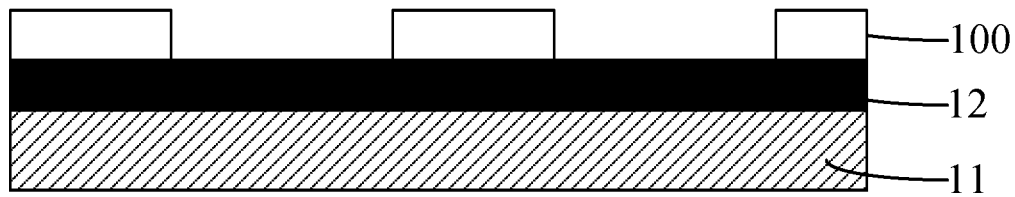
FIG. 8 is a third diagram illustrating another structure of the black matrix according to an embodiment of the present disclosure.
Figure 9:
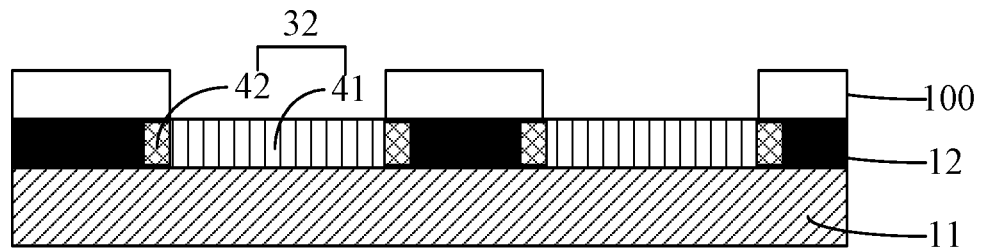
FIG. 9 is a fourth diagram illustrating another structure of the black matrix according to an embodiment of the present disclosure.

Herein, as shown in FIG. 8, portions in the second photoresist layer where the positive photoresist is not retained (namely, portions in the second photoresist layer which are exposed to light rays, as shown in FIG. 6) is referred to as the first regions, while portions in the first photoresist layer where the negative photoresist is not retained (namely, portion 32 in the first photoresist layer, as shown in FIG. 9) is referred to as the second regions. As a result, a line width of the first photoresist pattern is smaller than that of the second photoresist pattern, and a projection of each of the first regions on the base substrate is located within that of a corresponding one of the second regions on the base substrate.

As shown in FIG. 6, in the step 102, the first exposure process may be conducted on the second photoresist layer 13 using a mask 21. Due to the fact that the photoresist in second photoresist layer 13 is positive, the photoresist in exposure regions thereof becomes dissolvent substance after being subject to light irradiation, which can be removed by a developing process (namely, the photoresist within the first regions 31 of the second photoresist layer 13). Further, the black negative photoresist within the first photoresist layer covered by the first regions 31 reacts with the developer and dissolve thereinto. Also, as for the black negative photoresist covered by unexposed second photoresist layer 13, it dissolves alike due to its contact with the developer in a lateral direction, which results in its peripheral parts of the black negative photoresist covered by unexposed second photoresist layer 13 dissolve (namely, the photoresist within the second regions of the first photoresist layer 12 is removed). As a result, by taking advantage of the second photoresist layer 13 as a surface cover, the black negative photoresist is prevented from getting a direct and large-area contact with developer for reaction. As such, a film/layer peel-off occurrence due to a direct contact between black matrix photoresist and developer for fabricating the black matrix having a narrow line width can be prevented, and the black matrix having a narrow line width can be achieved accordingly.

Figure 7:
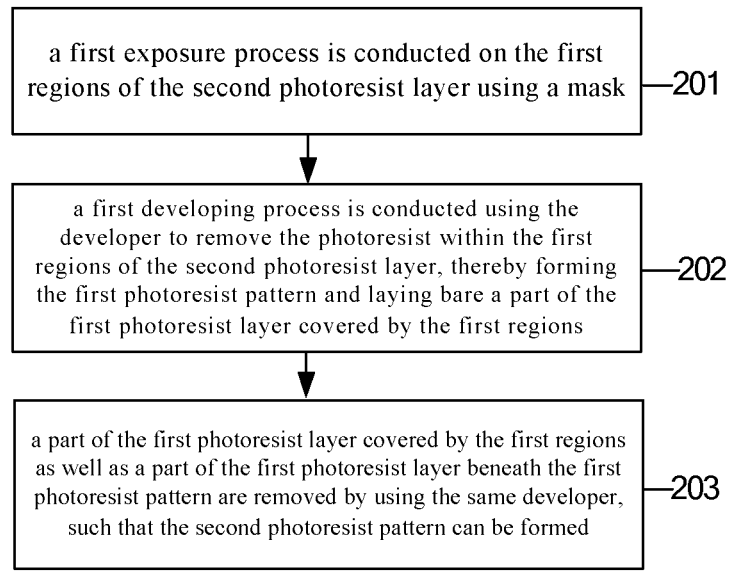
FIG. 7 is a second flow chart illustrating another method for fabricating a photoresist pattern according to an embodiment of the present disclosure.

As an example, as shown in FIG. 7, the above step 102 can be further divided into steps 201~203 as below.

In step 201, a first exposure process is conducted on the first regions of the second photoresist layer using a mask.

As shown in FIG. 6, in step 201, a first exposure process, for example, an ultraviolet (UV) exposure is conducted on the first regions 31 of the second photoresist layer 13 using a mask 21. At this time, the positive photoresist within the exposure regions 31 (namely, the first regions 31) is inclined to decompose into small molecules which can be dissolved by the developer due to UV light irradiation.

Accordingly, the first photoresist layer 12 beneath the second photoresist layer 13 has not yet been exposed up to this timing. Because of black negative photoresist within the first photoresist layer 12, the black negative photoresist can also be dissolved by the developer.

In step 202, a first developing process is conducted using the developer to remove the photoresist within the first regions of the second photoresist layer, thereby forming the first photoresist pattern and laying bare a part of the first photoresist layer covered by the first regions.

As shown in FIG. 8, after step 201, the first developing process is conducted by the developer, which can remove the photoresist within the first regions 31 of the second photoresist region 13, so as to form the first photoresist pattern 100 and lay bare a part of the first photoresist layer 12 covered by the first regions 31.

In step 203, a part of the first photoresist layer covered by the first regions as well as a part of the first photoresist layer beneath the first photoresist pattern are removed using the same developer, such that the second photoresist pattern can be formed.

As shown in FIG. 9, because the part of the first photoresist layer 12 laid bare in step 202 is black negative photoresist, the black negative photoresist can be dissolved by the developer. As a result, in step 203, the part of the first photoresist layer 12 covered by the first regions 31 (i.e., the parts 41 as shown in FIG. 9) continues to react with the developer and be removed thereby.

Figure 10:
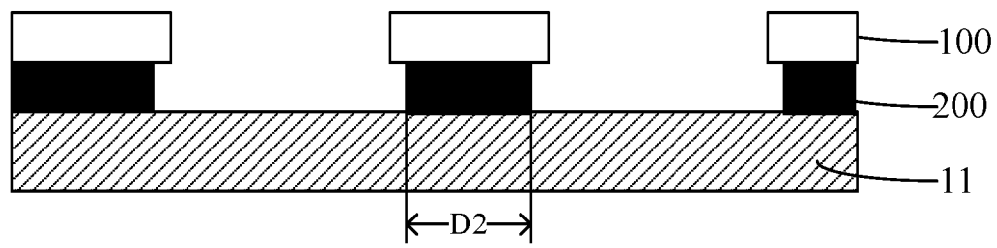
FIG. 10 is a fifth diagram illustrating another structure of the black matrix according to an embodiment of the present disclosure.

At the same time, because the first photoresist layer 12 beneath the first photoresist pattern 100 is in contact with the developer laterally and reacts with the developer, which results in that peripheral parts of the black negative photoresist covered by the first photoresist pattern 100 (i.e., the parts 42 as shown in FIG. 9) dissolve. At this point of timing, the parts 41 and the parts 42 constitute the second regions 32 within the first photoresist layer 12. Thereby the second photoresist pattern 200 as shown in FIG. 10 is finally achieved.

In addition, the black negative photoresist and positive photoresist can form the first photoresist layer 12 and the second photoresist layer 13 respectively, and a photo-sensitivity range of the black negative photoresist and that of the positive photoresist may partially overlap.

Figure 11:
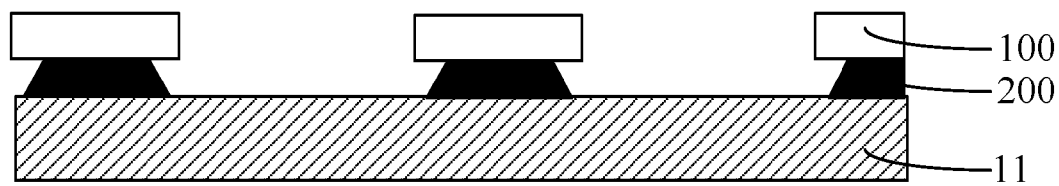
FIG. 11 is a sixth diagram illustrating another structure of the black matrix according to an embodiment of the present disclosure.

As such, in step 201, when the first exposure process is conducted on the second photoresist layer 13 using a mask 21 (which is provided with light transmitting regions and light shielding regions, the light transmitting regions corresponding to the first regions of the second photoresist layer), due to the fact that a photo-sensitivity range of the black negative photoresist and that of the positive photoresist partially overlap, the black negative photoresist within the first photoresist layer 12 can be exposed slightly as well. As a result, the second photoresist pattern as shown in FIG. 11 can be achieved by steps 201~203, thereby enabling the second photoresist pattern to have a relatively mild slope angle.

Specifically, as shown in FIG. 6, a line width (i.e., a predetermined line width) of each of the light shielding regions of the mask 21 is indicated by D1. And as shown in FIG. 10, a line width of the black negative photoresist within the second photoresist pattern 200 is indicated by D2. As a result, an offset between the line width D1 and the line width D2 of the black negative photoresist within the second photoresist pattern 200 is C (not shown), i.e., D2+C=D1. In this description, the line width of each of the light shielding regions of the mask 21 is also referred to as the predetermined line width.

Accordingly, the predetermined line width D1 of the mask 21 may be computed in accordance with a difference value C between a preset line width of the black matrix and a preset line width of the light shielding regions of the mask as well as the preset line width of the black matrix D2 (i.e., a line width of the second photoresist pattern). Further, in a situation where a first developing time period as well as a temperature and concentration of the developer are fixed, the first exposure process is conducted on the second photoresist layer 13 using a mask having the preset line width of D1, so as to form a black matrix having a line width of D2.

For example, the line width D2 of the black matrix preset by an operator is 4 µm. Put it another way, the black matrix to be fabricated is expected to have a line width of 4 µm. And the difference value C between the line width of the black matrix and the line width of each of the shielding regions of the mask is preset as 4 µm too. Therefore, the line width of each of the light shielding regions of the mask 21 can be computed as D1=D2+C=4 µm+4 µm=8 µm. Accordingly, in a situation where a first developing time period as well as a temperature and concentration of the developer are fixed, an operator can derive the black matrix having a line width of 4 µm from the mask 21 having a line width of 8 µm.

Therefore it can be seen that, in a situation where a first developing time period as well as a temperature and concentration of the developer are fixed, the line width of the black matrix can be adjusted or tuned by adjusting the line width D1 of each of the light shielding regions of the mask 21.

Alternatively, the first developing process may be conducted on the first regions 31 of the second photoresist layer 13, by controlling at least one of the temperature and concentration of the developer, and by adjusting the line width of the black matrix, namely by the predetermined developing time period. Alternatively, the first developing process may be conducted, by controlling the predetermined developing time period, and by adjusting the line width of the black matrix, namely by at least one of the temperature and concentration of the developer.

Herein, the developer specifically includes at least one of low-concentration inorganic alkaline and low-concentration organic alkaline. The inorganic alkaline may include at least one of sodium hydroxide, potassium hydroxide, sodium bicarbonate, and potassium bicarbonate. The organic alkaline may include at least one of amine compounds, alkali metal salts, and alkyl lithium compounds. And the amine compounds may be chosen from a group of tetramethylammonium hydroxide (TMAOH), sodium methoxide, and potassium ethoxide.

Up to now, the photoresist within the first regions 31 of the second photoresist layer 13 and the photoresist within the second regions 32 of the first photoresist layer 12 are removed by the first exposure process and the first developing process, so as to obtain the first photoresist pattern 100 and the second photoresist pattern 200.

In step 103, the second exposure process is conducted on the first photoresist pattern and the second photoresist pattern. The first photoresist pattern is removed after the second developing process, and the second photoresist pattern is retained as the black matrix.

Figure 12:
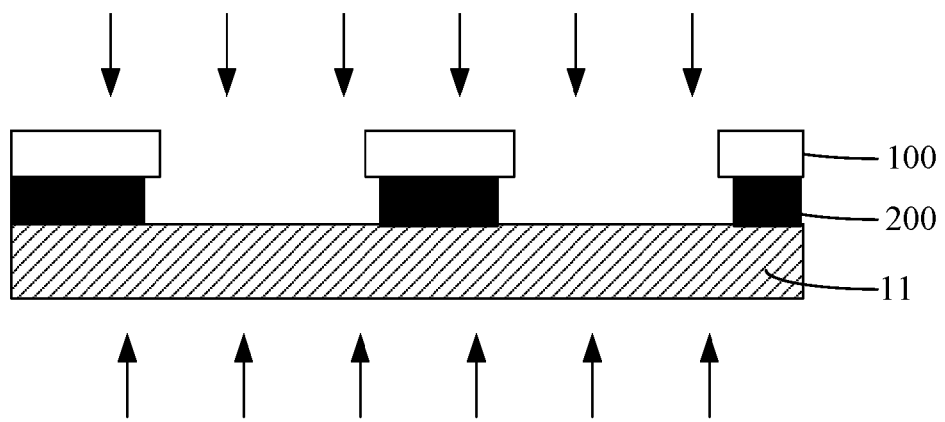
FIG. 12 is a seventh diagram illustrating another structure of the black matrix according to an embodiment of the present disclosure.

As shown in FIG. 12, in step 103, the second exposure process may be conducted by a light irradiation having a high intensity both from the upper side and from the lower side in a full coverage manner. Namely, the second exposure process is conducted both on the first photoresist pattern 100 from the upper side of the base substrate 11 and on the second photoresist pattern 200 from the lower side of the base substrate 11. As a result, the positive photoresist within the first photoresist pattern 100 remained after the second exposure process completely decomposes, whilst the negative photoresist within the second photoresist pattern 200 remained after the second exposure process are completely cross-linked.

Needless to say, an exposure amount and an exposure wavelength for the second exposure process may be adjusted in accordance with actual needs. There is no upper limit for the exposure amount. Nevertheless, a relatively larger exposure amount is preferable, in accordance with its Takt Time.

Figure 13:
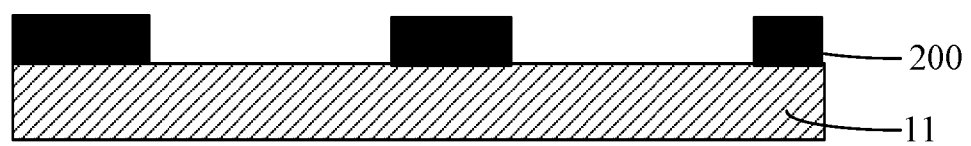
FIG. 13 is an eighth diagram illustrating another structure of the black matrix according to an embodiment of the present disclosure.

When the second exposure process and the second developing process are conducted, the positive photoresist within the first photoresist pattern 100 decomposes into small molecules under a strong exposure condition at this moment. As a result, there is no more dissolve reaction with the developer. Accordingly, the second photoresist pattern 200 retained on its surface of the base substrate 11 is not easily subject to a reaction with the developer, due to its cross-linking polymerization of the second photoresist pattern 200 retained, which finally forms a black matrix as shown in FIG. 13 on the base substrate 11.

In step 104, a high-temperature curing process is conducted on the base substrate with the black matrix formed thereon.

Specifically, the curing process is conducted on the base substrate 11 with the black matrix formed thereon for a complete curing in a situation where temperature is within a range of 160°~230°.

In addition, another embodiment of the present disclosure provides a color filter, which includes the black matrix fabricated by any of the above methods.

Specifically, a color filter product may be obtained finally, by arranging a color coating layer, a planarization layer, an Indium-Tin-Oxide (ITO) layer, and a spacer layer on the black matrix as shown in FIG. 13 sequentially.

Further, yet another embodiment of the present disclosure provides a display device, which includes any one of the above color filters.

Specifically, the display device can be but is not limited to: liquid crystal panels, electronic papers, Organic Light-Emitting Diode (OLED) panels, mobile phones, tablet PCs, TVs, displays, digital photo frames, navigators and any other products or components having display functions.

According to the method for fabricating the photoresist pattern, the color filter and the method for fabricating the same, and the display device provided by embodiments of the present disclosure, negative photoresist and positive photoresist are coated on a base substrate to form a first photoresist layer and a second photoresist layer at first. Further, a first exposure process and a first developing process are conducted on first regions of the second photoresist layer, so as to remove the positive photoresist within the first regions of the second photoresist layer and the negative photoresist within second regions of the first photoresist layer, and to obtain a first photoresist pattern retained within the second photoresist layer and a second photoresist pattern retained within the first photoresist layer, wherein a line width of the first photoresist pattern is smaller than that of the second photoresist pattern, and a projection of each of the first regions on the base substrate is located within that of a corresponding one of the second regions on the base substrate. Finally, a second exposure process is conducted on the first photoresist pattern and the second photoresist pattern, and a second developing process is conducted to remove the first photoresist pattern but to retain the second photoresist pattern that serves as the black matrix. As seen from the above, as for the first developing process, the first regions of the second photoresist layer exposed react with the developer and dissolve. After the dissolve process completes, the negative photoresist within the first photoresist layer that has not yet been exposed and is beneath the first regions happens to dissolve in turn. Further, the negative photoresist that is covered by the unexposed second photoresist layer happens to dissolve alike, due to its contact with the developer in a lateral direction, which results in that peripheral parts of the negative photoresist that is covered by the unexposed second photoresist layer dissolves. As a result, by taking advantage of the positive photoresist within the second photoresist layer as a surface cover, the negative photoresist within the first photoresist layer is prevented from getting a direct and large-area contact with developer for reaction. As such, when the negative photoresist is adopted as the black negative photoresist used for fabricating the black matrix, a film/layer peel-off occurrence due to a direct contact between black matrix photoresist and developer for fabricating the black matrix having a narrow line width can be prevented, the black matrix having a narrow line width can be achieved accordingly, and its transmittance ratio and aperture ratio of the display device can be improved.

In addition, all specific features, structures, materials, and characteristics can be combined in a suitable manner in one or more than one embodiment, within the brief and detailed description.

The above are merely the preferred embodiments of the disclosure and shall not be used to limit the scope of the disclosure. It should be noted that, a person skilled in the art may make improvements and modifications without departing from the principle of the disclosure, and these improvements and modifications shall also fall within the scope of the disclosure.

What is claimed is:

1. A method for fabricating a photoresist pattern comprising:
    coating negative photoresist on a base substrate to form a first photoresist layer;
    coating positive photoresist on the first photoresist layer to form a second photoresist layer;
    conducting a first exposure process on first regions of the second photoresist layer;
    conducting a first developing process to remove the positive photoresist within the first regions of the second photoresist layer and form a first photoresist pattern of the second photoresist layer, and remove the negative photoresist within second regions of the first photoresist layer to form a second photoresist pattern of the first photoresist layer, wherein a line width of the first photoresist pattern is larger than that of the second photoresist pattern, and a projection of each of the first regions on the base substrate is located within that of a corresponding one of the second regions on the base substrate;
    conducting a second exposure process on the first photoresist pattern and the second photoresist pattern; and
    conducting a second developing process to remove the first photoresist pattern but to retain the second photoresist pattern.

2. The method according to claim 1, wherein
    the first exposure process is conducted on the second photoresist layer using a mask that is provided with light transmitting regions and light shielding regions, the light transmitting regions corresponding to the first regions of the second photoresist layer; and
    the first developing process is conducted using developer to remove the positive photoresist within the first regions of the second photoresist layer as well as the negative photoresist beneath the positive photoresist to be removed and at its perimeter, so as to obtain the first photoresist pattern and the second photoresist pattern.

3. The method according to claim 2, wherein the mask is provided with a predetermined line width of 8 µm, while a line width of the second photoresist pattern is 4 µm.

4. A method for fabricating a color filter comprising the method for fabricating a photoresist pattern according to claim 3.

5. The method according to claim 2, wherein the conducting the first developing process using the developer comprises:
conducting the first developing process in accordance with a predetermined temperature or concentration of the developer.

6. A method for fabricating a color filter comprising the method for fabricating a photoresist pattern according to claim 5.

7. The method according to claim 2, wherein the developer includes at least one of low-concentration inorganic alkaline and low-concentration organic alkaline.

8. The method according to claim 7, wherein the inorganic alkaline includes at least one of sodium hydroxide, potassium hydroxide, sodium bicarbonate, and potassium bicarbonate;
wherein the organic alkaline includes at least one of amine compounds, alkali metal salts, and alkyl lithium compounds; and
wherein the amine compounds is chosen from a group of tetramethylammonium hydroxide (TMAOH), sodium methoxide, and potassium ethoxide.

9. A method for fabricating a color filter, comprising the method for fabricating a photoresist pattern according to claim 2.

10. The method according to claim 1, wherein the conducting the first developing process on the first regions of the second photoresist layer comprises:
conducting the first developing process on the first regions of the second photoresist layer in accordance with a predetermined developing time period.

11. A method for fabricating a color filter comprising the method for fabricating a photoresist pattern according to claim 10.

12. The method according to claim 1, wherein the negative photoresist is black negative photoresist; and
a photo-sensitivity range of the black negative photoresist and that of the positive photoresist partially overlap or do not overlap.

13. A method for fabricating a color filter comprising the method for fabricating a photoresist pattern according to claim 12.

14. The method according to claim 1, further comprising:
conducting a vacuum dry process and a soft bake process on the base substrate provided with the first photoresist layer, subsequent to forming the first photoresist layer; and
conducting another vacuum dry process and another soft bake process on the base substrate provided with the first photoresist layer and the second photoresist layer, subsequent to forming the second photoresist layer.

15. The method according to claim 1, wherein conducting the second exposure process comprises:
conducting the second exposure process both on the first photoresist pattern from the upper side of the base substrate and on the second photoresist pattern from the lower side of the base substrate; and
wherein conducting the second developing process comprises:
conducting the second developing process using developer to remove the first photoresist pattern but to retain the second photoresist pattern.

16. The method according to claim 1, further comprising:
curing the base substrate provided with the second photoresist pattern.

17. The method according to claim 16, wherein the curing process is conducted in a situation where temperature is within a range of 160°~230°.

18. A color filter comprising the photoresist pattern formed by using the method according to claim 1.

19. A display device, comprising the color filter according to claim 18.

20. A method for fabricating a color filter, comprising the method for fabricating a photoresist pattern according to claim 1.

* * * * *